(12) United States Patent
Mikamo

(10) Patent No.: US 10,816,946 B2
(45) Date of Patent: Oct. 27, 2020

(54) SIGNAL PROCESSING DEVICE

(71) Applicant: DENSO CORPORATION, Kariya, Aichi-pref. (JP)

(72) Inventor: Kazuki Mikamo, Kariya (JP)

(73) Assignee: DENSO CORPORATION, Kariya (JP)

( * ) Notice: Subject to any disclaimer, the term of this patent is extended or adjusted under 35 U.S.C. 154(b) by 489 days.

(21) Appl. No.: 15/698,874

(22) Filed: Sep. 8, 2017

(65) Prior Publication Data

US 2018/0081332 A1 Mar. 22, 2018

(30) Foreign Application Priority Data

Sep. 16, 2016 (JP) .................. 2016-181656

(51) Int. Cl.
*G05B 11/01* (2006.01)
*G05B 15/02* (2006.01)
*H04L 12/66* (2006.01)
*H03K 17/687* (2006.01)

(52) U.S. Cl.
CPC ........... *G05B 15/02* (2013.01); *H03K 17/687* (2013.01); *H04L 12/66* (2013.01)

(58) Field of Classification Search
CPC ................ G05B 12/02; H04L 12/66
USPC .......................................... 700/12
See application file for complete search history.

(56) References Cited

U.S. PATENT DOCUMENTS

| | | | |
|---|---|---|---|
| 4,914,312 A | 4/1990 | Akama et al. | |
| 2007/0121930 A1* | 5/2007 | Koga | H04B 3/542 |
| | | | 379/413.03 |
| 2009/0277247 A1* | 11/2009 | Hagari | F02P 5/152 |
| | | | 73/35.04 |
| 2012/0056630 A1* | 3/2012 | Itou | G01P 15/125 |
| | | | 324/679 |
| 2012/0269253 A1* | 10/2012 | Daecke | H04L 25/03878 |
| | | | 375/232 |
| 2013/0151127 A1* | 6/2013 | Saito | F02D 41/222 |
| | | | 701/111 |
| 2013/0314608 A1* | 11/2013 | Ito | H04N 5/4403 |
| | | | 348/734 |

(Continued)

FOREIGN PATENT DOCUMENTS

| | | |
|---|---|---|
| JP | H07-210790 A | 8/1995 |
| JP | H08-307725 A | 11/1996 |
| JP | H09-046199 A | 2/1997 |

(Continued)

*Primary Examiner* — Md Azad
(74) *Attorney, Agent, or Firm* — Posz Law Group, PLC

(57) ABSTRACT

A signal processing device includes a signal processor, a plurality of communicators, and a switch controller. The signal processor performs a preset signal processing for a detection signal that is output from a sensor. The plurality of communicators output communication data from an output terminal after converting data from the signal processor to communication data for different communication methods. The switch controller controls the data output operation of each of the plurality of communicators and then performs a switch operation to validate the data output operation of one of the plurality of communicators based on a selection signal that selects one of the communication methods. The switch controller sets the plurality of communicators to a high impedance output state at least at a time of performing the switch operation.

11 Claims, 11 Drawing Sheets

(56) References Cited

U.S. PATENT DOCUMENTS

2013/0334872 A1* 12/2013 Kodama ................. H02J 3/385
   307/1
2017/0276521 A1* 9/2017 Bruggemann ..... G01D 5/24471

FOREIGN PATENT DOCUMENTS

| JP | H11-345386 A | 12/1999 |
| --- | --- | --- |
| JP | 2000-285067 A | 10/2000 |
| JP | 2015-228171 A | 12/2015 |
| JP | 2017-126882 A | 7/2017 |

* cited by examiner

FIG. 5

| COMMUNICATION METHOD | EXAMPLE OF ECU LOAD | |
|---|---|---|
| | TERMINAL STATE | RESISTANCE VALUE OF COMM. TERMINAL |
| ANALOG OUTPUT | PU/PD | 180k~500k |
| SENT PUSH-PULL SENT CURVE | PU | 10k~50kΩ |
| FREQUENCY OUTPUT | PU | 2.2k |
| ELEC. CURRENT COMM. (PSI5) | CONNECTED TO PW SOURCE LINE | ≈0Ω (PW SOURCE OUTPUT IMPEDANCE) |

SIGNAL PROCESSING DEVICE

CROSS REFERENCE TO RELATED APPLICATION

The present application is based on and claims the benefit of priority of Japanese Patent Application No. 2016-181656, filed on Sep. 16, 2016, the disclosure of which is incorporated herein by reference.

TECHNICAL FIELD

The present disclosure generally relates to a signal processing device that processes a detection signal output from a sensor.

BACKGROUND INFORMATION

When a detection signal is output from a sensor, the detection signal may have to be processed and transmitted to a destination electronic control unit (a destination "ECU") by various communication methods. In such case, a signal processing device may adopt different communication methods for different destination devices, which may necessitate using different signal processing methods and having different hardware configurations for communicators in the signal processing device. That is, different hardware configurations may use different integrated circuits ("ICs").

With regard to how communication data is handled, various prior techniques are known, in terms of (i) switching between a synchronous method and an asynchronous method, and (ii) switching by seeing whether a certain communication procedure/protocol of a bi-directional communication method has been successfully performed. See, for example, patent document 1 listed below for the prior techniques.

(Patent document 1) Japanese Patent Laid-Open No. H11-345386

A plurality of functional blocks may be used in the signal processing device, and an output from the plurality of functional blocks may be selectively switched to be output from a single output terminal in order to realize a single, common hardware configuration. However, in such case, the switching between the plurality of different functional blocks may cause interference among the different communication methods. That is, the functional blocks implementing different communication methods may interfere with each other.

When an interference is caused, the power consumption by signal processing circuits may dramatically increase and may lead to a low power source voltage in the ECU supplying power to the signal processing circuits. Also in such as case, abnormal data may be transmitted from the signal processing circuits, which may cause a deterioration of data reliability and/or cause a malfunction, for example, when the destination ECU cannot read the data.

SUMMARY

It is an object of the present disclosure to provide a signal processing device that is capable of outputting, from a single output terminal, communication data implementing respectively different communication methods without causing interference among the different communication methods.

In an aspect of the present disclosure, the signal processing device includes: a signal processor, a plurality of communicators and a switch controller.

The signal processor performs a preset signal processing for a detection signal that is output from a sensor.

The plurality of communicators respectively convert a processed data output from the signal processor to a communication data based on different communication methods, for an output from a single output terminal.

The switch controller controls an output operation of the communication data by the plurality of communicators. The switch controller performs a switch operation that validates the output operation of one of the plurality of communicators based on a selection signal for selecting one of the different communication methods.

Based on the configuration described above, even when the detection data may have to be transmitted to different signal destinations by using different communication methods (i.e., different methods are used for different ECUs), such a situation is accommodated without using different ICs for implementing the different communication methods. In such case, the switch controller is configured to set an output state of all of the plurality of communicators to a high impedance state, at least when the switch operation is performed, so that interference among the plurality of communicators implementing different communication methods is limited at the time of the switch operation. Based on the above-described configuration, the signal processing device is enabled to output communications data using different communication methods from a single output terminal without causing interference among the plurality of different communicators.

BRIEF DESCRIPTION OF THE DRAWINGS

Objects, features, and advantages of the present disclosure become more apparent from the following detailed description made with reference to the accompanying drawings, in which:

FIG. 5 illustrates a table diagram of communication methods and example ECU loads;

DETAILED DESCRIPTION

Hereafter, two or more embodiments of the present disclosure are described with reference to the drawings. In each of the following embodiments, the same numerals are used to represent the same configurations/components, for the brevity of the description.

First Embodiment

Figure 1:
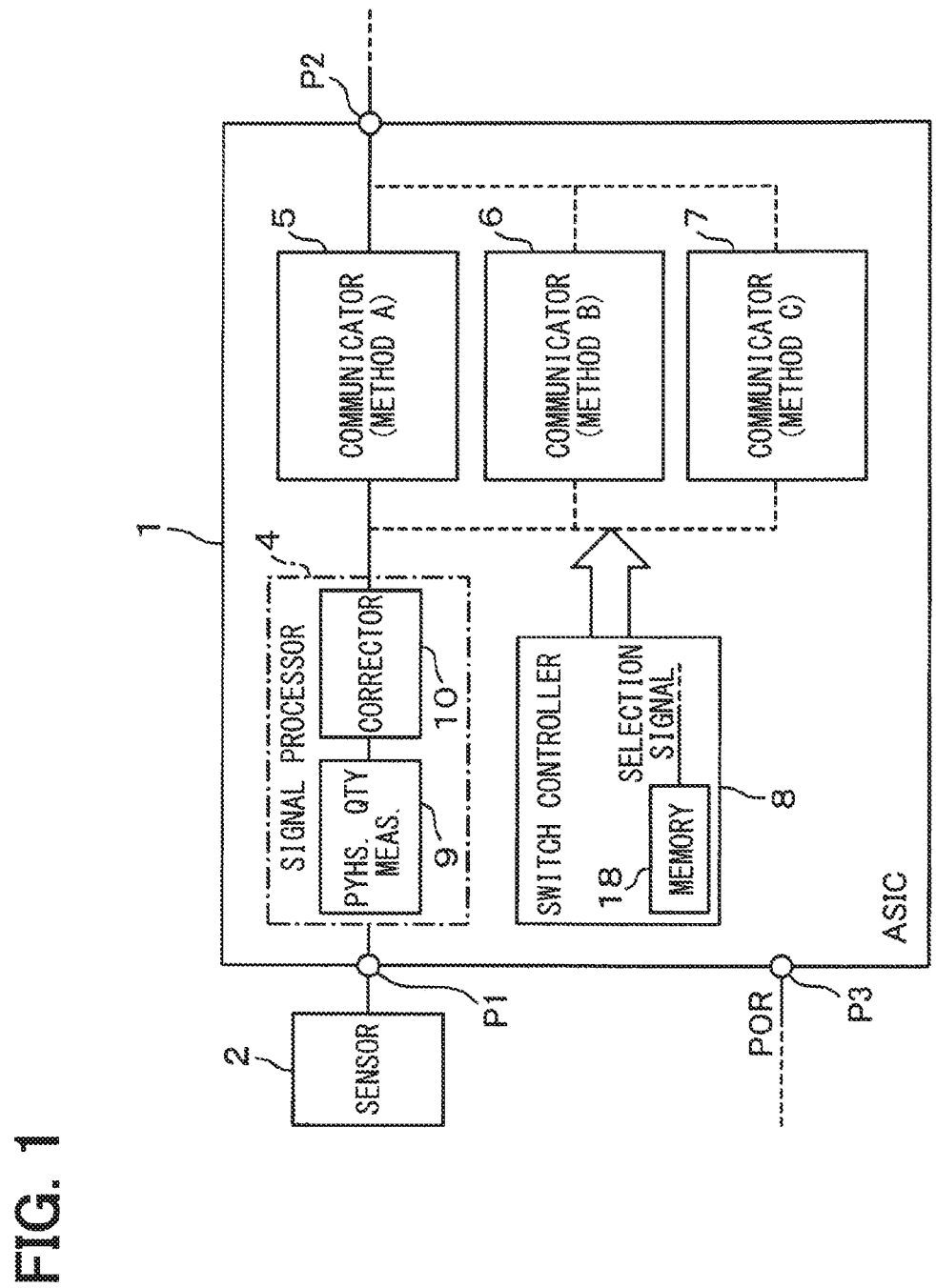
FIG. 1 illustrates a block diagram of a signal processing device.
Figure 2:
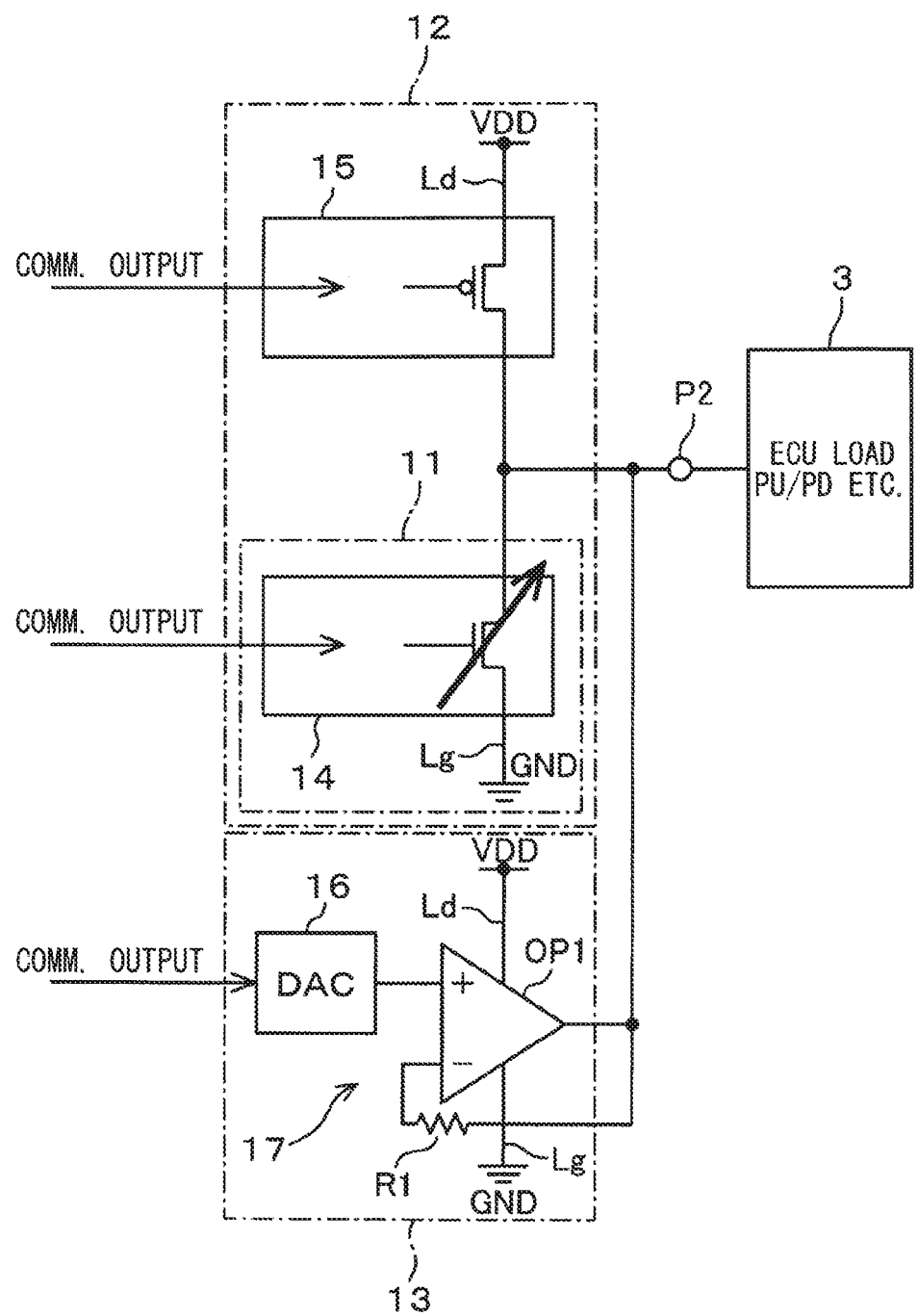
FIG. 2 illustrates a block diagram of an output part of a communicator.

With reference to FIG. 1, a signal processing device 1 is configured to processes a detection signal from a sensor 2 input through a terminal P1, and to output data after the signal processing (i.e., processed data) at terminal P2 via communication to an ECU 3, as shown in FIG. 2, that is external to the signal processing device 1. The signal processing device 1 may be provided as an Application Specific Integrated Circuit "ASIC."

The sensor 2 may be an airflow meter, pressure sensor, vacuum-boost sensor, and the like, measuring the amount of airflow, pressure, vacuum, etc. in and to a vehicle engine.

The signal processing device 1 is provided with communicators 5-7, a signal processor 4, a switch controller 8, and the like.

The signal processor 4 is configured to perform preset signal processing to a detection signal output from the sensor 2, and includes a physical quantity measurer 9 and a corrector 10.

The physical quantity measurer 9 amplifies the detection signal that is input via the terminal P1, and outputs the signal by performing an analog-to-digital (A/D) conversion to the amplified detection signal.

The corrector 10 performs a correction process, such as correcting the nonlinearity of the sensor 2 based on the digital data received from the physical quantity measurer 9, and outputs the data after such processing.

The communicators 5-7 convert the processed data received from the signal processor 4 based on different communication methods, and respectively output the converted data to a single output terminal P2.

The communication method implemented by each of the communicators 5-7 may vary, that is, various communication methods may be implementable by the communicators 5-7, with each communicator implementing a different communication method than the other. Examples of the different implemented communication methods include, a frequency type output communication, a pulse width modulation (PWM) type output communication, a push-pull (simple) type SENT (Single Edge Nibble Transmission) protocol communication, a curved (emission reduction) type SENT protocol communication, an analog voltage type output communication, a current type output communication, and the like.

In the present embodiment, a communication method of the communicator 5 is designated as "communication method A", a communication method of the communicator 6 is designated as a "communication method B", and a communication method of the communicator 7 is designated as "communication method C." In the present embodiment, one of the communication methods A-C is the simple type SENT protocol communication or the emission reduction type SENT protocol communication.

The communicator 5 converts the processed data to a communication data in a format based on communication method A, and outputs the data after the conversion via a circuit of an output stage.

The communicator 6 converts the processed data to a communication data in a format based on communication method B, and outputs the data after the conversion via a circuit of the output stage.

The communicator 7 converts the processed data to a communication data in a format based on communication method C, and outputs the data after the conversion via a circuit of the output stage.

With reference to FIG. 2, the output stage circuits 11, 12, and 13 of each of the respective communicators 5-7 may have different configurations, that is, each of the output stage circuits 11, 12, and 13 may have different hardware configurations.

FIG. 2 shows details of the configuration of each of the output stages 11, 12, and 13. The output stage 11 may be used for a frequency type output communication or a current type output communication. The output stage 11 is provided as a low potential side driver 14 connected to a position between the output terminal P2 and a ground line Lg that provides a reference potential GND (e.g., 0 V) of the circuit. The low potential side driver 14 drives the output terminal P2 to have a low potential level that is a potential level of the ground line Lg and based on the communication data to be output, that is, the communication data output from the terminal P2. As for the low potential side driver 14, the driver 14 may be configured as a variable driver. That is, the low potential side driver 14 may be provided with two or more switching elements, such as N-channel type MOS transistors, that are connected in parallel at a position between the output terminal P2 and the ground line Lg. The variable capacity of the driver 14 may be realized by varying the number of switching elements.

Further, the low potential side driver 14 is configured to perform an ON drive of the switching element, for providing a constant current from the output terminal P2 to the ground line Lg, that is, the low potential side driver 14 is configured to provide constant current control.

Since the output stage 11 is configured to have the variable drive capacity for driving the driver 14 and to perform the constant current control, the output stage 11 is adaptable to perform the current type output communication.

The output stage 11 is configured to variably drive the driver 14 by providing the drive capacity, that is, an electric current supply, based on the adapted communication method. In such case, the switching element of the low potential side driver 14 is turned ON and OFF by the drive signal corresponding to the communication data to be output.

The output stage 12 is used for the push-pull type SENT communication or the PWM type output communication. The output stage 12 is provided as a combination of (i) a high potential side driver 15 connected at a position between a power source line Ld and the output terminal P2 to which a source voltage VDD (e.g., 5 V) of the circuit is provided and (ii) the low potential side driver 14. The high potential side driver 15 drives the output terminal P2 to have a high potential level that is at the potential level of the power source line Ld. The high potential side driver 15 is provided with a switching element such as a P-channel type MOS transistor connected at a position between the power source line Ld and the output terminal P2.

Since the drive capacity of the low potential side driver 14 is configured to be variable, the output stage 12 is capable of providing a drive capacity according to the adapted communication method. That is, in such case, the switching element of the high potential side driver 15 and the switching element of the low potential side driver 14 are complementarily turned ON and OFF by a drive signal corresponding to the communication data to be output.

The output stage 13 is used for a curve type SENT communication or for the analog voltage output type communication. The output stage 13 is provided with (i) a digital-to-analog converter (DAC) 16 that is a D-A converter for receiving a digital communication from at least one of the communicators 5, 6, and 7 and converting the digital communication to an analog output to be output at the output terminal P2, and (ii) a driver amplifier 17 that amplifies the analog output of the DAC 16 and outputs the amplified data to the output terminal P2. The driver amplifier 17 is provided as a combination of (i) an operational amplifier (op-amp) OP1 that receives the output of the DAC 16 with its non-inverted input terminal and (ii) a resistor R1 connected to a position between an inverted input terminal of the OP1 and an output terminal of the OP1.

As shown in FIG. 1, the switch controller 8 is provided with a memory 18. The memory 18 may be a nonvolatile memory and configured to store a selection signal. The selection signal is a signal that selects the communication methods used by the communicators 5-7. The selected communication method selected by the selection signal is determined based on how the signal processing device 1 is used. The switch controller 8 controls the output operation of the communication data by the communicators 5-7.

Specifically, the switch controller 8 controls the switch operation that confirms the output operation of one of the communicators 5-7 based on the selection signal stored by the memory 18. At least when the switch operation is performed, the switch controller 8 sets an output state of all of the communicators 5-7 to a high impedance state. Details of the switching operation are described in greater detail below.

The signal processing device 1 is configured to receive a reset signal POR from a device external to the signal processing device 1 via a terminal P3. The reset signal POR is input to the device 1 at a power-ON time, i.e., at a start time of the signal processing device 1, or when the signal processing device 1 receives noise external to the device 1.

When the reset signal POR is received, each of the components in the signal processing device 1 is configured to perform a reset operation, that is, each of the components of device 1 is either restarted from an initial state or resumes operation. Accordingly, the switch controller 8 performs the above-described switching operation when the device 1 receives the reset signal POR.

A "POR circuit" (not shown) is a circuit that outputs a reset signal POR when a power supply voltage or internal voltage of the signal processing device 1 is lower than a reference voltage. The power supply voltage of the signal processing device 1 may be compared to a reference voltage using a device such as a comparator. The comparator may be included as a component of the POR circuit and provide instructions via a signal to cause the POR circuit to output a reset signal based on a voltage comparison.

The operation and effects of the above-described configuration are described in greater detail below.

Figure 3:
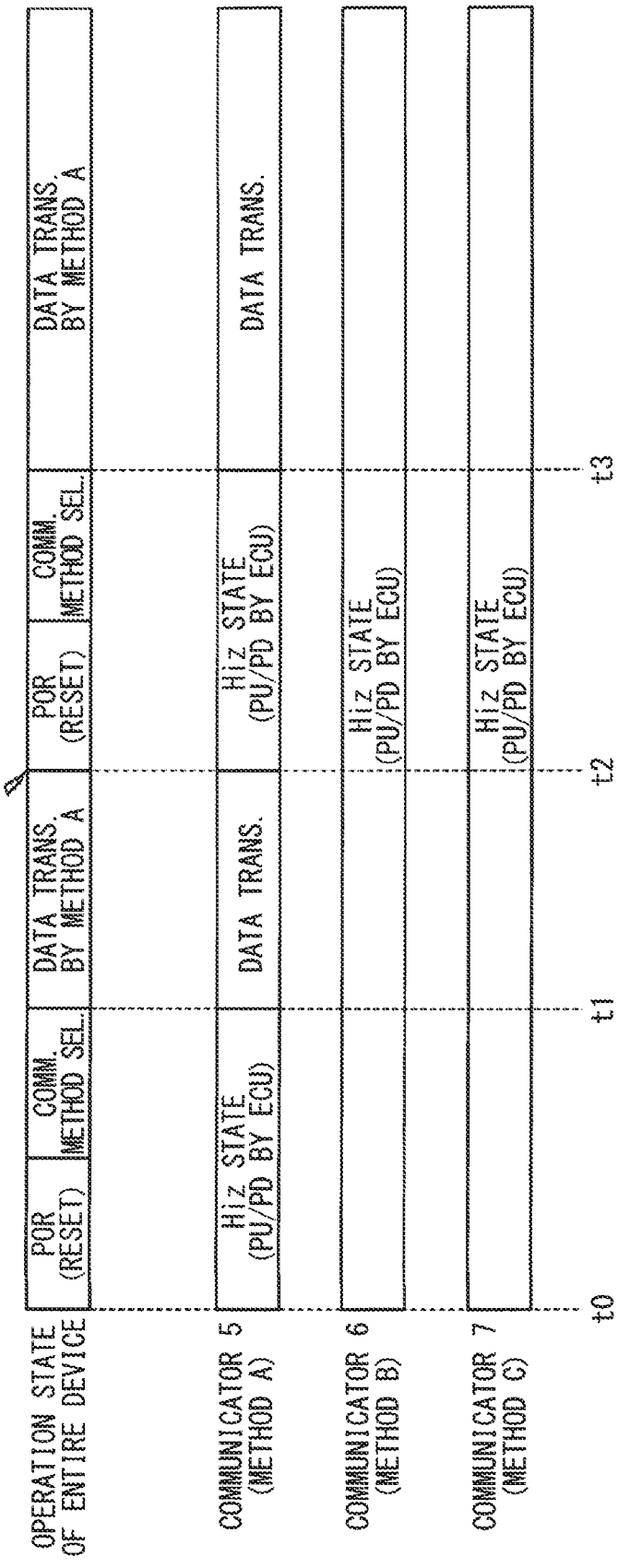
FIG. 3 illustrates a timing chart of an operation state of different communicators.

The following assumes a situation where "the communication method A" is selected based on the selection signal. That is, as shown in FIG. 3, when the reset signal POR is given at time t0, each of the components of the signal processing device 1 is reset. At such moment, the output state of each of the communicators 5-7 is set to a high impedance state, also referred to herein as a "Hiz" state.

In such case, the output terminal P2 is either pulled up ("PU") or pulled down ("PD") relative to the load, for example, relative to the ECU 3. Setting the Hiz state is performed by the switch controller 8. The communicators 5-7 can be set so that their output states can be set to the Hiz state.

That is, when the output stage 11 is used as an output stage of the communicators 5-7, the Hiz state is realized by turning OFF the drive of the switching element of the low potential side driver 14.

When the output stage 12 is used as an output stage of the communicators 5-7, the Hiz state is realized by turning OFF the drive of both the switching elements of the high potential side driver 15 and the low potential side driver 14.

When the output stage 13 is used as an output stage of the communicators 5-7, the Hiz state is realized by turning OFF the drive of the switching elements on both the high side and low side of the output stage of the op-amp OP1.

As shown in FIG. 3, after resetting each of the components, the switch controller 8 reads the selection signal from the memory 18 and selects a communication method based on the read selection signal. Then, at time t1, the switch controller 8 stops the Hiz state for the output state of the communicator 5, because the communicator 5 corresponds to the communicator configured to output the selected communication method, in this case, "communication method A," and the switch controller 8 confirms and proceeds with the output operation of the communicator 5.

Thereby, after time t1, in the signal processing device 1, the processed data output from the signal processor 4 is converted to the communication data based on communication method A by the communicator 5, and is output from the output terminal P2.

The output state of the communicators 6 and 7 at or after time t1 is maintained as the Hiz state. In the period from time t0 when the reset signal POR is given to time t1 when a communication method is selected, the output state of all of the communicators 5-7 is set to the Hiz state.

The signal processing device 1 performs the same operation as described above, i.e., performs a start-up operation, when the reset signal POR is provided due to system noise or the like.

That is, if the reset signal POR is provided at time t2, each of the components of the signal processing device 1 is reset, and the output state of the communicator 5 is set to the Hiz state.

After each of the components is reset, the switch controller 8 selects a communication method, for example, communication method A from communicator 5, stops the Hiz state of the communicator 5 at time t3, and confirms and proceeds with the output operation of communicator 5.

After time t3, the signal processing device 1 outputs the converted data from the output terminal P2 by converting the processed data from the signal processor 4 to communication data based on communication method A by communicator 5.

At or after time t3, the output states of the communicators 6 and 7 are maintained as the Hiz state. Even in such case, during a period from time t2 when the reset signal POR is given to time t3 when the switch operation confirms and proceeds with the output operation of communicator 5, the output state of all of the communicators 5-7 is set to the Hiz state.

According to the present embodiment described above, the following effects are obtainable.

The communicators 5-7 convert the processed data output from the signal processor 4 to communication data based on the different communication methods, and output the communication data from the single output terminal P2. The switch controller 8 that controls the output operation of the communication data by each of the communicators 5-7 performs the switch operation that confirms and commences the output operation of one of the communicators 5-7 based on the selection signal that selects a communication method.

Based on such configuration, even when the detection data from a sensor may have to be transmitted by using different communication methods to respective ECUs 3, for example, to transmit detection data to different communication destinations, the same ASIC may be used for all of the different communication methods, instead of using different ICs for each of the different communication methods.

In such case, at least at the time of performing the switch operation, the switch controller 8 sets the output state of all of the communicators 5-7 to the Hiz state. In other words, in the present embodiment, after setting the output state of all of the communicators 5-7 to the Hiz state, one of three communicators 5-7 is selected based on the selection signal and the output operation is confirmed and performed only for one of the three communicators 5-7 selected by the selection signal.

In the present embodiment, when the communication method is switched from one method to another, the communicators 5-7 implementing the different communication methods do not cause interference amongst each other, which prevents various problems associated with such interference, such as the deterioration of data reliability, malfunction of the system, and the like.

Thus, in the present embodiment, the device 1 is able to output communication data based on different communication methods from one output terminal P2, while preventing interference between the communicators 5-7 implementing the different communication methods.

As long as the output state of the communicators 5-7 not selected to output the communication data is set to the Hiz state after the switch controller 8 selects and instructs one of the communicators 5-7 to output communication data, the interference described above can be limited or prevented. However, by setting all communicators 5-7 to the Hiz state prior to the selection, confirmation and commencement of the output operation, such an effect (i.e., the ability to limit interference amongst the communicators) is more readily achievable.

In the present embodiment, the switch controller 8 is configured to perform the switch operation when the reset signal POR is given, which enables the switch controller 8 to set the output state of all of the communicators 5-7 to the Hiz state until the selection signal selecting the communication method is sent to one of the communicators 5-7 to confirm and commence communication output. In such manner, interference amongst the communicators 5-7 is better limited or prevented.

Second Embodiment

In the second embodiment, the operation control of the communicators 5-7 by the switch controller 8 is different from the first embodiment. The following description refers not only to FIG. 4 but also to FIG. 1 as to the configuration of the signal processing device.

Figure 4:
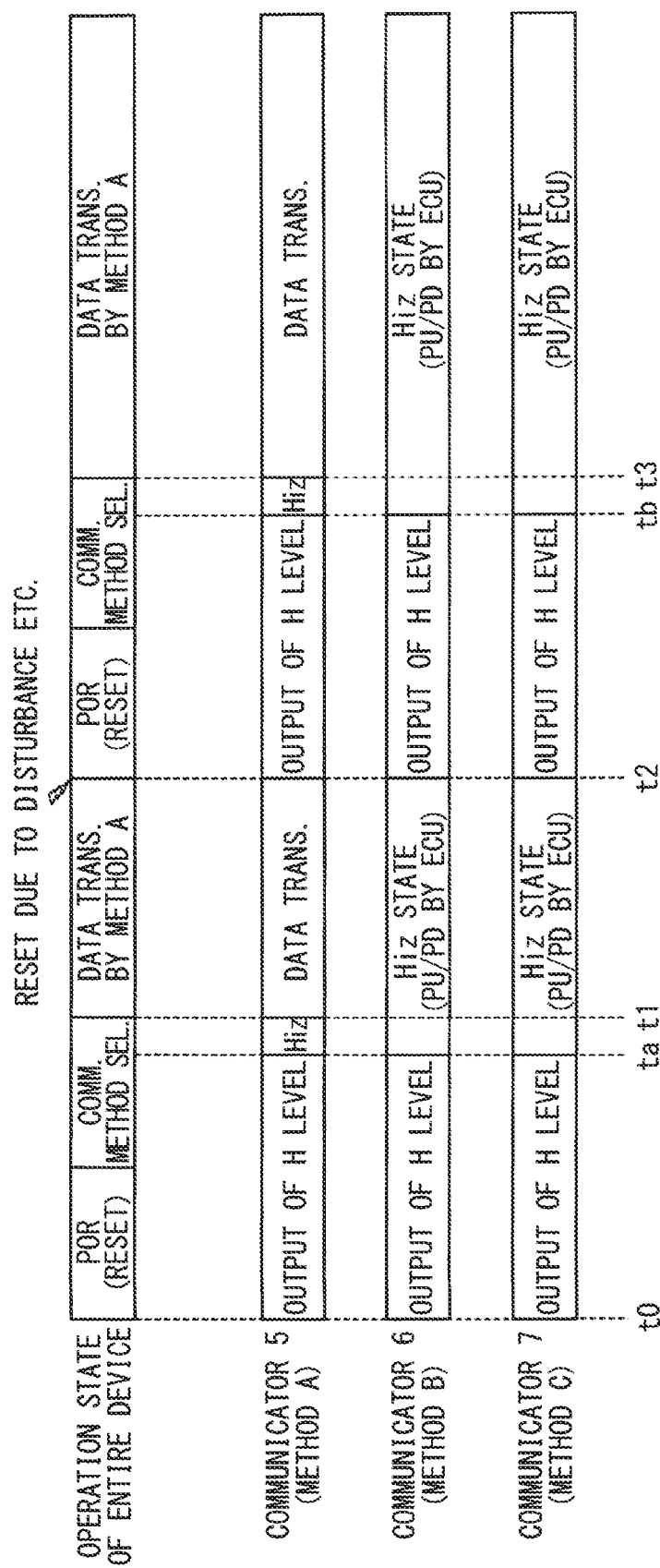
FIG. 4 illustrates a timing chart of the operation state of different communicators.

The second embodiment also assumes an example situation where the selection signal selects communication method A. That is, as shown in FIG. 4, when the reset signal POR is given at time t0, each of the components of the signal processing device 1 is reset. Under such circumstance, the switch controller 8 controls the communicators 5-7 so that each of the outputs of the communicators 5-7 has the same level, e.g., a high level of 5 V, which may be designated as an "H level."

After each of the components is reset, just like the first embodiment, the switch controller 8 reads the selection signal from the memory 18, and selects a communication method based on the selection signal.

The switch controller 8 in this case sets the output state of each of the communicators 5-7 to the Hiz state at time to for a preset amount of time occurring prior to the completion of the communication method selection at time t1.

Then, at time t1, when the communication method selection is complete, the switch controller 8 stops communicator 5 from outputting the Hiz state, confirms the selection of communication method A, and instructs communicator 5 to proceed with the output operation based on communication method A.

At or after time t1, the signal processing device 1 converts the processed data output from the signal processor 4 to communication data based on communication method A by communicator 5, and outputs the converted data from the output terminal P2.

The output state of the communicators 6 and 7 is maintained as the Hiz state at or after time t1. In such case, during a period from time ta to time t1, that is, a period where a selection of the communication method is incomplete, the output state of all of the communicators 5-7 is set to the Hiz state.

When the reset signal POR is given due to the external noise (i.e., electrical noise outside of the device 1) or the like, the same start-up operation as described above is performed. That is, when the reset signal POR is given at time t2, each of the components of the signal processing device 1 is reset and each of the outputs of the communicators 5-7 is set to the H level.

After each of the components is reset, the switch controller 8 selects a communication method. The switch controller 8 sets the output state of each of the communicators 5-7 to the Hiz state at time tb, i.e., a time prior to the completion of a communication method selection.

Then, at time t3, when the communication method selection is complete, the output of the Hiz state from communicator 5 is stopped and the output operation is validated. That is, the communication output of communicator 5 is confirmed and commenced.

At or after time t3, the signal processing device 1 converts the processed data output from the signal processor 4 to the communication data based on communication method A, and the communicator 5 outputs the converted data from the output terminal P2.

The output state of each of the communicators 6 and 7 is maintained to the Hiz state at or after time t3. Even in such case, during a period of preset time from tb prior to the completion of a communication method selection to time t3, i.e., the output state of all of the communicators 5-7 is set to the Hiz state.

In the present embodiment described above, just like the first embodiment, the switch controller 8 sets the output state of all of the communicators 5-7 to the Hiz state at least at the time of performing the switch operation. That is, in the present embodiment, after setting the output state of all of the communicators 5-7 to the Hiz state, one of the three communicators 5-7 is selected based on the selection signal and the output operation is confirmed and commenced only for one of the selected communicators 5, 6, or 7.

Therefore, the same operational effects of the first embodiment are achievable by the present embodiment.

Third Embodiment

Figure 7:
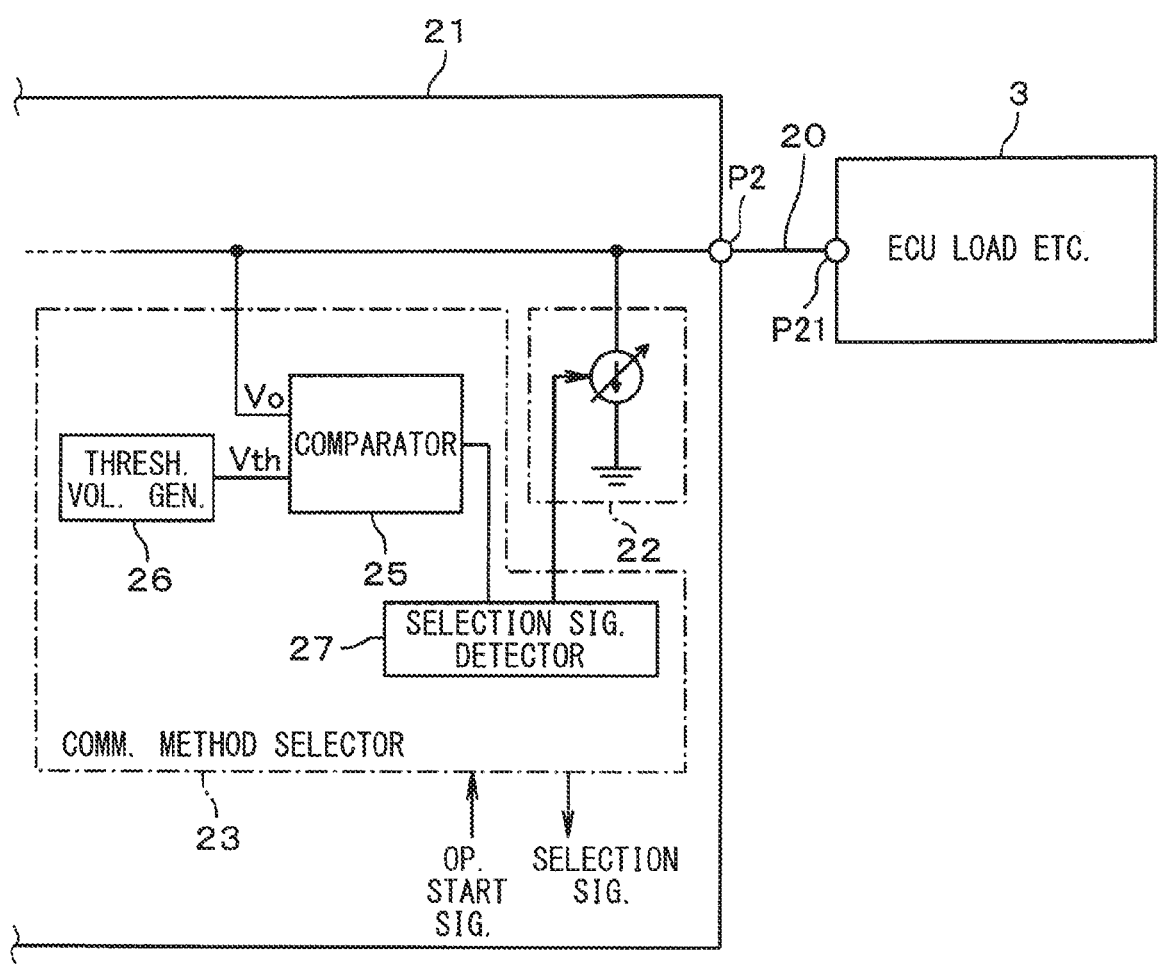
FIG. 7 illustrates a block diagram of a portion of the signal processing device including an internal load and a communications method selector.

As shown in FIG. 5, depending on the communication method, the terminal states (PU, PD, etc.) and the resistance values at communication terminal P21 (as shown in FIG. 7) for an ECU 3 connected to the output terminal P2 via a communication line 20 are different.

More practically, in an analog voltage output communication (also designated as an "analog output"), the communication terminal P21 may either be in the PU state or in the PD state, and, the resistance value of the terminal P21 is set in a range of 180 kΩ-500 kΩ.

In a push-pull type SENT communication (also designated as a "SENT push-pull") and the curve type SENT communication (also designated as "SENT curve"), the communication terminal P21 is in the PU state, and the resistance value is set in a range of 10 kΩ-50 kΩ.

In a frequency output type communication (also designated as a "frequency output"), the communication terminal P21 is in the PU state, and the resistance value is set to 2.2 kΩ, for example.

In an electric current output type communication (also designated as an "electric current communication") such as PSI5, the communication terminal P21 is connected to the power source line. Therefore, as the resistance value of the communication terminal P21 is the impedance of power source line, i.e., takes a very small resistance value, (~0Ω), in such case.

That is, since the state and the resistance value of the communication terminal P21 are different depending on the communication method, the voltage applied to the output terminal P2 is different depending on the communication method when a preset load is connected to the output terminal P2.

In the present embodiment, in view of the above-described situation, a communication method is automatically selected in terms of the load connected to a signal processing device 21, and communication is performed based on the selected communication method. In other words, the communication method is automatically selected based on the load characteristics of a load such as ECU 3.

Figure 6:
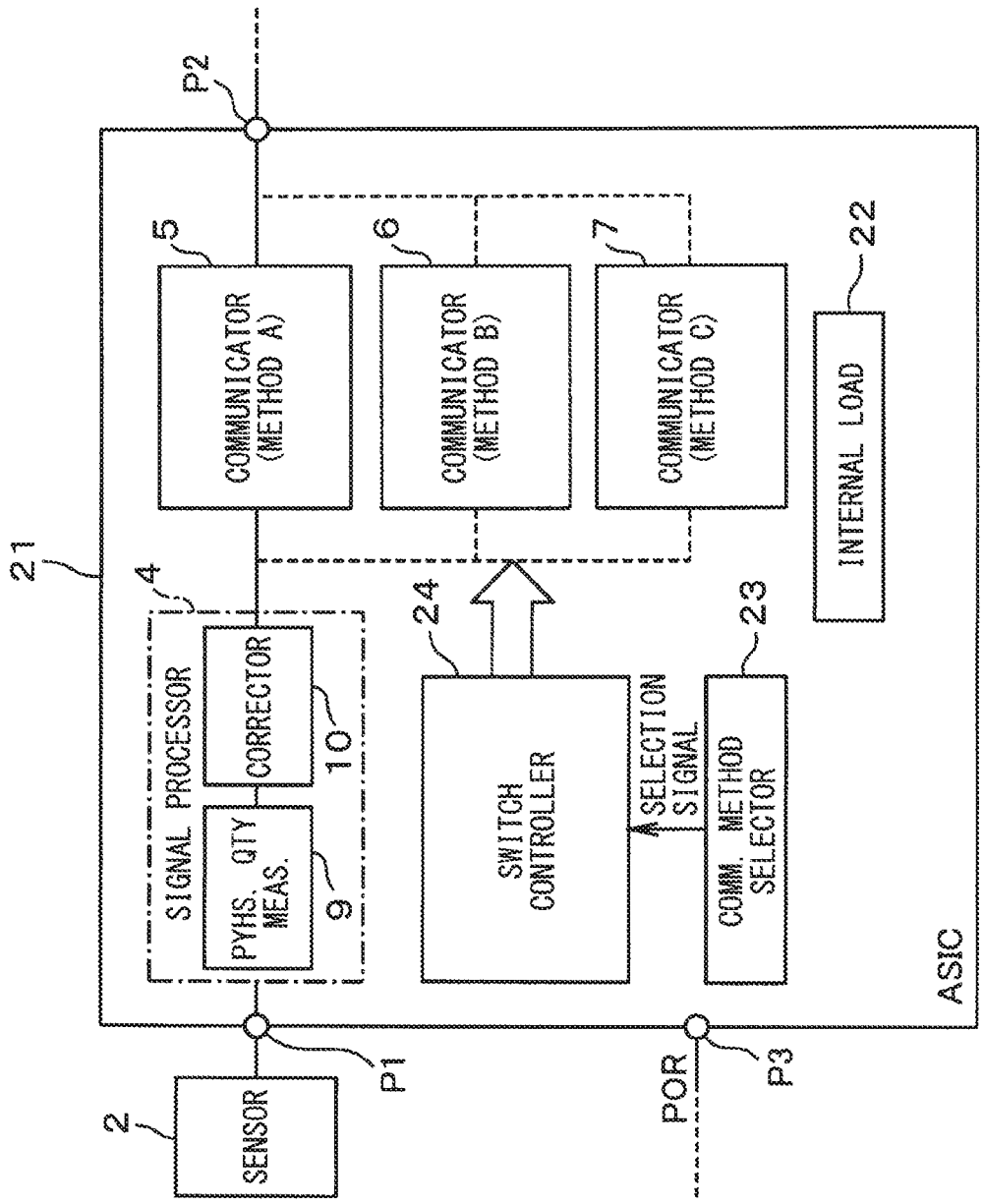
FIG. 6 illustrates a block diagram configuration of the signal processing device.

As shown in FIG. 6, the signal processing device 21 of the present embodiment is different from the signal processing device 1. Signal processing device 21 includes the addition of an internal load 22 and a communication method selector 23, and a switch controller 24 in place of the switch controller 8. The internal load 22 is connectable to the output terminal P2.

The communication method selector 23 detects a voltage of the output terminal P2 in a connected state, i.e., when the internal load 22 is connected to the output terminal P2, and generates a selection signal for selecting a communication method based on the result of the comparison between the detection value and a preset threshold. That is, the communication method selector 23 measures a voltage at output terminal P2 when an external device such as ECU 3 is connected at the output terminal P2. The communication method selector 23 measures an external load of the ECU 3, which may differ from communication to communication, for every instance of communication, for the purpose of determining the communication type. The communication method selector 23 measures the external load of ECU to determine what communication method should be used by the device 1 to communicate with the ECU 3.

The switch controller 24 operates in a similar manner as the switch controller 8. However, the switch controller 24 in the present embodiment selects a communication method based on the selection signal given from the communication method selector 23.

The internal load 22 and the communication method selector 23 described above may be provided more practically as a configuration shown in FIG. 7.

That is, as shown in FIG. 7, the internal load 22 is provided with a current source that is connected at a position between the output terminal P2 and the ground line Lg. The current source is capable of controlling, that is, varying, a current value.

In such manner, the internal load 22 serves as a plurality of internal loads having respectively different impedance values. That is, changing the current value of the current source means changing the impedance value of the internal load 22. In such case, the constant current of the internal load 22 is switched by the communication method selector 23. Signal processing device 21 also provides that the constant current of the internal load 22 may be set to zero.

The communication method selector 23 is provided with a comparator 25, a threshold voltage generator 26, and a selection signal generator 27.

The comparator 25 compares a voltage Vo of the output terminal P2 with a threshold voltage Vth generated by the threshold voltage generator 26. As used here, the voltage Vo may also be referred to as "a detection value of the voltage" or ("a detected voltage") of the output terminal P2. The threshold voltage Vth may also be referred to as a "preset threshold" or a "preset threshold voltage."

The threshold voltage generator 26 is able to change the voltage value of the generated threshold voltage Vth. The selection signal generator 27 generates a selection signal based on the output of the comparator 25 while performing a setup of the constant current of the internal load 22, and a setup of the threshold voltage Vth.

The communication method selector 23 having the above-described configuration sets the constant current and the threshold voltage Vth of the internal load 22, and generates a selection signal based on the output of the comparator 25 upon receiving an operation start signal from a controller or the like (not illustrated). The operation start signal may be generated when the signal processing device 21 is started.

The two determination methods for automatic selection of the communication method using the above-described configuration are described in greater detail below. The following description assumes one of the four communication methods, from among the analog output, the SENT push-pull (or the SENT curve), the frequency output, and the electric current communication, is suitable for selection.

(First Determination Method)

In the first determination method, the constant current of the internal load 22 is set to a constant current value Ia, and the threshold voltage Vth is switched to one of three levels, that is, either a first threshold V1, a second threshold V2, or a third threshold V3. The thresholds V1-V3 are represented by four inequations (1)-(4).

In the following inequations (1)-(4) the power source voltage on the ECU 3 side is designated as VDD, the resistance value of the communication terminal P21 in the analog output is designated as a value Ra, the resistance value of the communication terminal P21 in the SENT push-pull is designated as a value Rs, and the resistance value of the communication terminal P21 in the frequency output is designated as a value Rf.

$$VDD-(Ia \times Rf) < V1 < VDD \tag{1}$$

$$VDD-(Ia \times Rs) < V2 < VDD-(Ia \times Rf) \tag{2}$$

$$VDD-(Ia \times Ra) < V3 < VDD-(Ia \times Rs) \tag{3}$$

$$V3 < V2 < V1 \tag{4}$$

Figure 8:
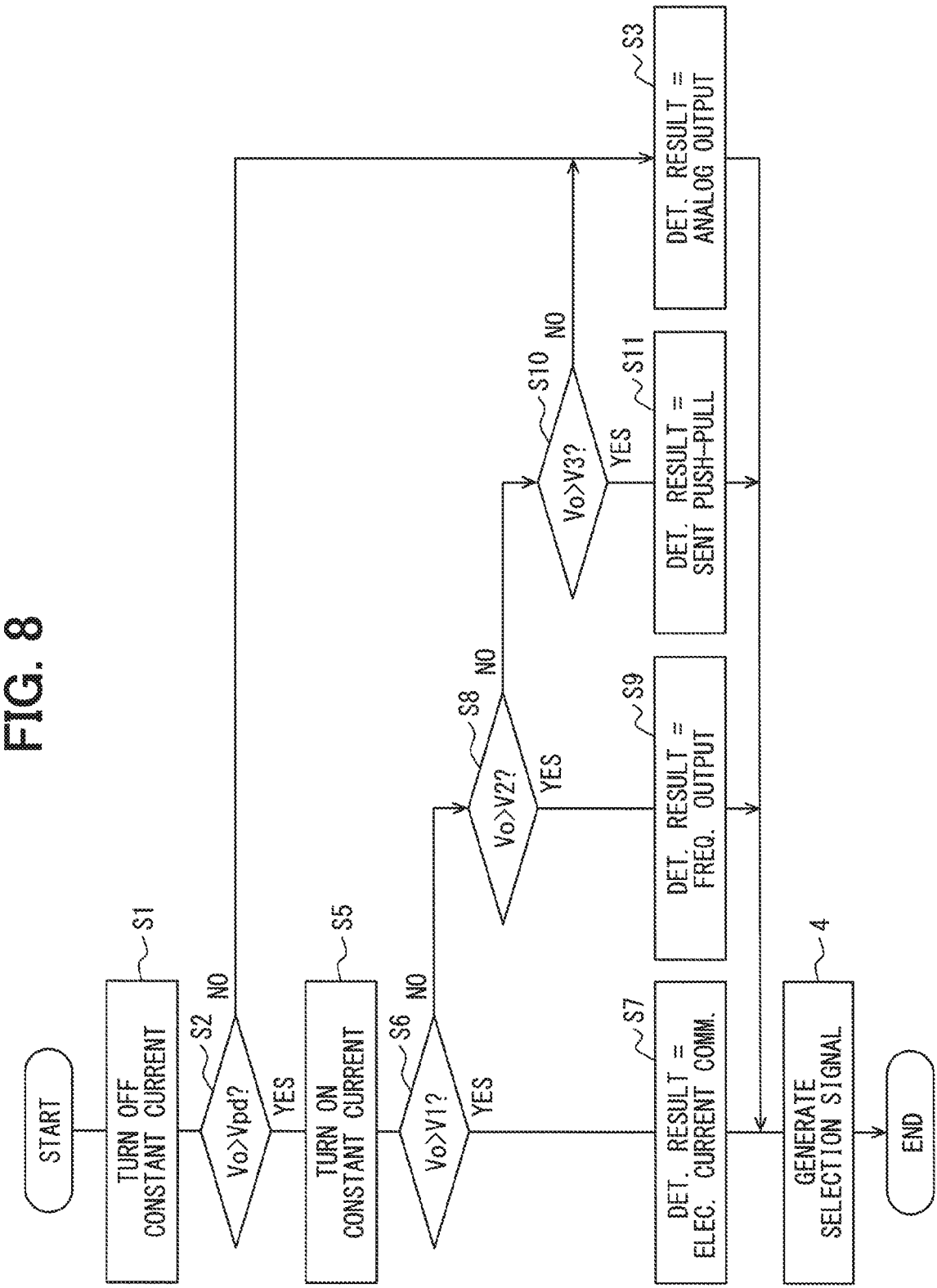
FIG. 8 is a flowchart of a first communication method determination operation.

As shown in FIG. 8, the constant current of the internal load 22 is set to zero at S1, that is, the constant current is turned OFF.

At S2, it is determined whether the voltage Vo in a constant current OFF state is greater than a preset determination value Vpd. The determination value Vpd is set to 0V or to a minute voltage value close to 0V.

When the voltage Vo is determined as equal to or less than the determination value Vpd (NO at S2), the process proceeds to S3.

At S3, the "analog output" is determined to be the communication method and stored as the determination result. After S3, the process proceeds to S4.

At S4, based on the stored determination result, a communication method is determined and the selection signal for the determined communication method is generated.

At S2, when it is determined that the voltage Vo is greater than the determination value Vpd (YES in Step S2), the process proceeds to S5.

At S5, the constant current of the internal load 22 is set to the current value Ia (constant current ON).

At S6, the threshold voltage Vth is switched to the first threshold V1, and a comparison between voltage Vo and first threshold voltage V1 is performed. As a result, when it is determined that the voltage Vo is higher than the first threshold V1 (YES at S6), the process proceeds to S7.

At S7, the "electric current communication" is determined to be the communication method and stored as the determination result.

At S6, when it is determined that the voltage Vo is less than the first threshold V1 (NO at S6), the process proceeds to S8.

At S8, the threshold voltage Vth is switched to the second threshold V2, and the comparison between voltage Vo and the second threshold voltage V2 is performed. When it is determined that the voltage Vo is greater than the second threshold V2 (YES at S8), the process proceeds to S9.

At S9, the "frequency output" is determined to be the communication method and stored as the determination result.

At S8, when it is determined that the voltage Vo is less than the second threshold voltage V2 (NO at S8), the process proceeds to S10.

At S10, the threshold voltage Vth is switched to the third threshold V3, and the comparison between the voltage Vo and the third threshold voltage V3 is performed. When it is determined that the voltage Vo is greater than the third threshold voltage V3 (YES at S10), the process proceeds to S11.

At Step S11, the "SENT push-pull" is determined to be the communication method and stored as the determination result.

At S10, when it is determined that the voltage Vo is less than the third threshold V3 (NO at S10), the process proceeds to S3.

As described above, at S3, the "analog output" is determined to be the communication method and stored as the determination result.

After the processes at S3, S7, S9, or S11, are performed and based on the stored determination result for the communication method, a communication method is determined at S4, and the selection signal with the determined communication method is generated.

(Second Determination Method)

In the second determination method, the constant current of the internal load 22 is switched to either a first current value I1, a second current value I2, or a third current value I3, and the threshold voltage Vth set to a fixed threshold Va. The current values I1-I3 are represented by following inequations (5)-(8). A threshold voltage VIL is used to determine a low voltage level in the ECU 3. The threshold voltage VIL may also be referred to herein as a determination threshold on a low potential side of an external controller that receives the communication data.

$$VIL < VDD - (I1 \times Ra) < Va \tag{5}$$

$$VIL < VDD - (I2 \times Rs) < Va \tag{6}$$

$$VIL < VDD - (I3 \times Rf) < Va \tag{7}$$

$$I1 < I2 < I3 \tag{8}$$

Figure 9:
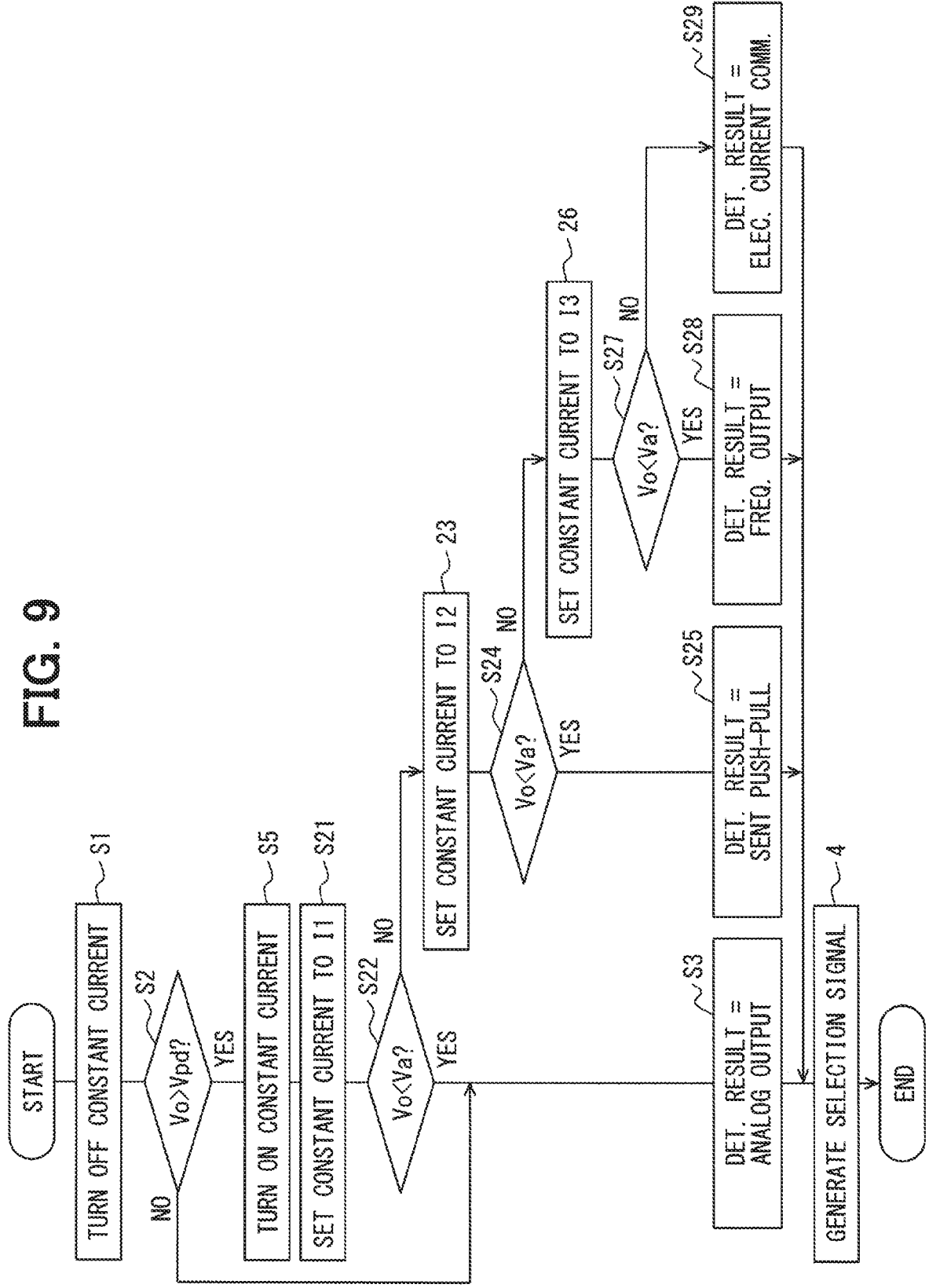
FIG. 9 is a flowchart of a second communication method determination operation.

As shown in FIG. 9, the processes of S1-S5 are similar to those of the first determination method. However, the process proceeds to S21 after S5.

At S21, a constant current is switched to the first current value I1. At S22, it is determined whether the voltage Vo is less than the threshold Va. When the voltage Vo is determined to be less than the threshold Va (YES at S22), the process proceeds to S3. As mentioned above, at S3, the "analog output" is determined to be the communication method and stored as the communication method determination result.

When the voltage Vo is determined to be equal to or greater than the threshold Va at S22, (NO), the process proceeds to S23.

At S23, a constant current is switched to the second current value I2. At S24, it is determined whether the voltage Vo is less than the threshold Va. When the voltage Vo is determined to be less than the threshold Va (YES at S23), the process proceeds to S25.

At S25, the "SENT push-pull" is determined to be the communication method and stored as the determination result.

When the voltage Vo is determined to be equal to or greater than the threshold Va at S24 (NO), the process proceeds to S26.

At S26, a constant current is switched to the third current value I3. At S27, it is determined whether the voltage Vo is less than the threshold Va. When the voltage Vo is determined to be less than the threshold Va (YES at S27), the process proceeds to S28.

At S28, the "frequency output" is determined to be the communication method and stored as the determination result.

When the voltage Vo is determined to be equal to or greater than the threshold Va at S28 (NO), the process proceeds to S29.

At S29, the "electric current communication" is determined to be the communication method and stored as the communication method determination result.

After the processes performed at S3, S25, S28, or S29, and based on the stored communication method determination result, a communication method is determined at S4, and the selection signal with the determined communication method is generated.

As described above, the signal processing device 21 of the present embodiment has a function which automatically determines the communication method suitable for the connected ECU 3. Therefore, even when the ECU 3 is connected which implements a different communication method from the method initially selected during an initial setup, the communication method of the ECU 3 is automatically determined by the signal processing device 21, and the communication is performed based on the suitable method.

When a first ECU 3 is replaced with another ECU 3 that implements a communication method different than the communication method used by the first ECU 3, the signal processing device 21 is able to automatically determine the communication method of the other ECU 3 after the first ECU 3 has been replaced, and then perform communication based on the determined communication method.

Since the terminal state of the output terminal P2 and the resistance value of the communication terminal are the same among the SENT push-pull and the SENT curve, as shown in FIG. 5, the determination cannot be automatically performed by the method described in the present embodiment. Therefore, when both of the SENT push-pull and the SENT curve are expected as possible communication method selections, the selection signal may be stored in advance in the memory 18, that is either the SENT push-pull or the SENT curve are stored in advance as the communication method in memory 18, as described in the first embodiment.

The current and impedance values of the internal load 22 are set so that the voltage value of the output terminal P2 when connected to the internal load 22 is higher than the threshold VIL of the ECU 3, that is, the external control device receiving the communication data. In such manner, data transmission errors are prevented, such as the reception of low-level data by the ECU 3 during a period when the signal processing device 21 is determining the communication method.

As for the configuration of the internal load 22 and the communication method selector 23, the above-described configuration may be modified.

For example, when the configuration including the output stage 11 or the output stage 12, as shown in FIG. 2, is adopted as the output stage circuit for communicators 5-7, the low potential side driver 14 may be operated in place of the internal load 22.

Figure 10:
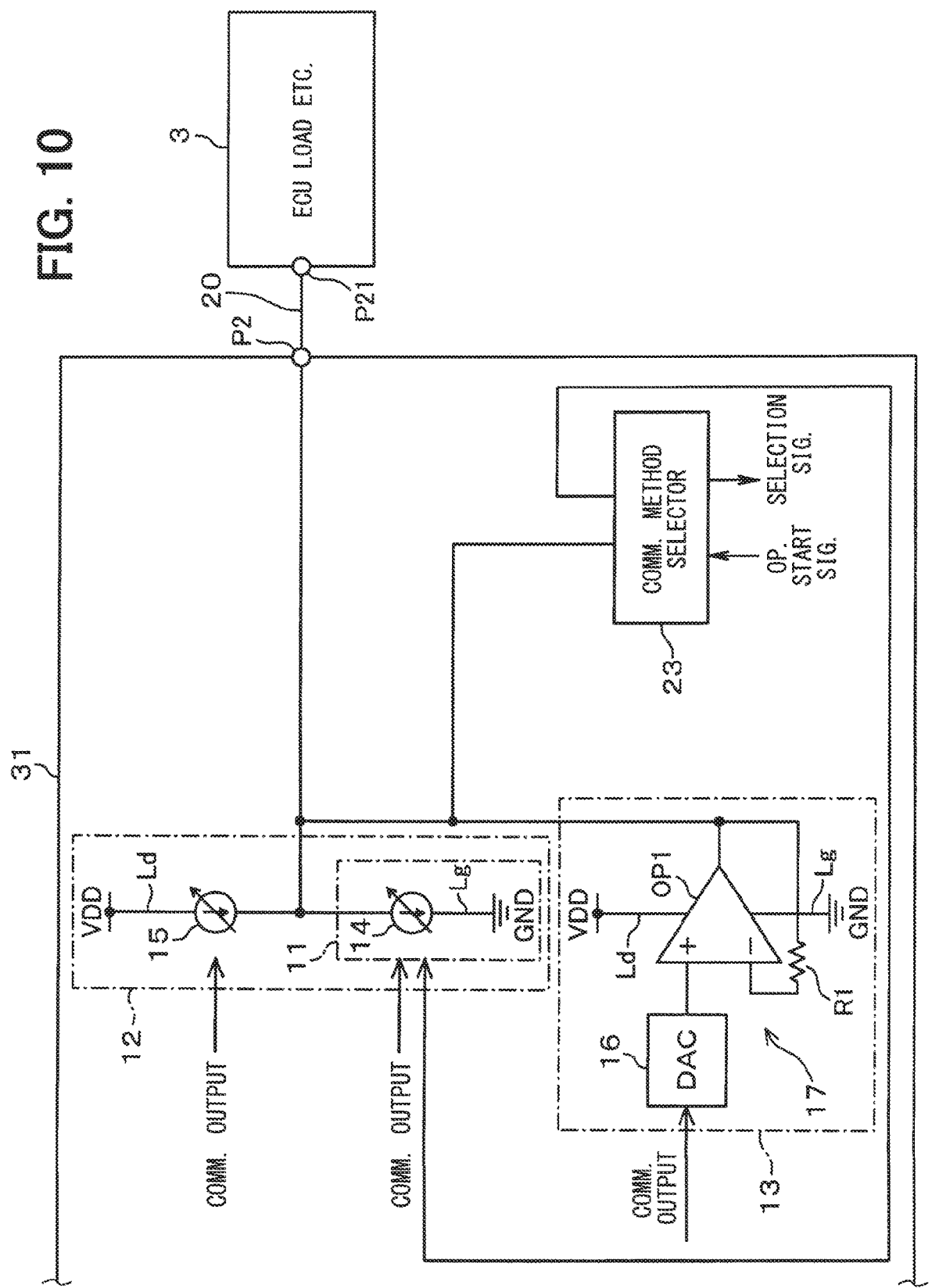
FIG. 10 illustrates a block diagram of the portion of the device including the internal load.

In such case, the low potential side driver 14 serves in place of the internal load 22, for example, like the configuration of a signal processor 31 shown in FIG. 10.

In such configuration, the impedance, like the impedance of internal load 22, may be changed by changing the current value of the low potential side driver 14. In such manner, the circuit of signal processor 31 can be provided on a much smaller scale compared to configurations having many different internal loads 22.

Fourth Embodiment

Figure 11:
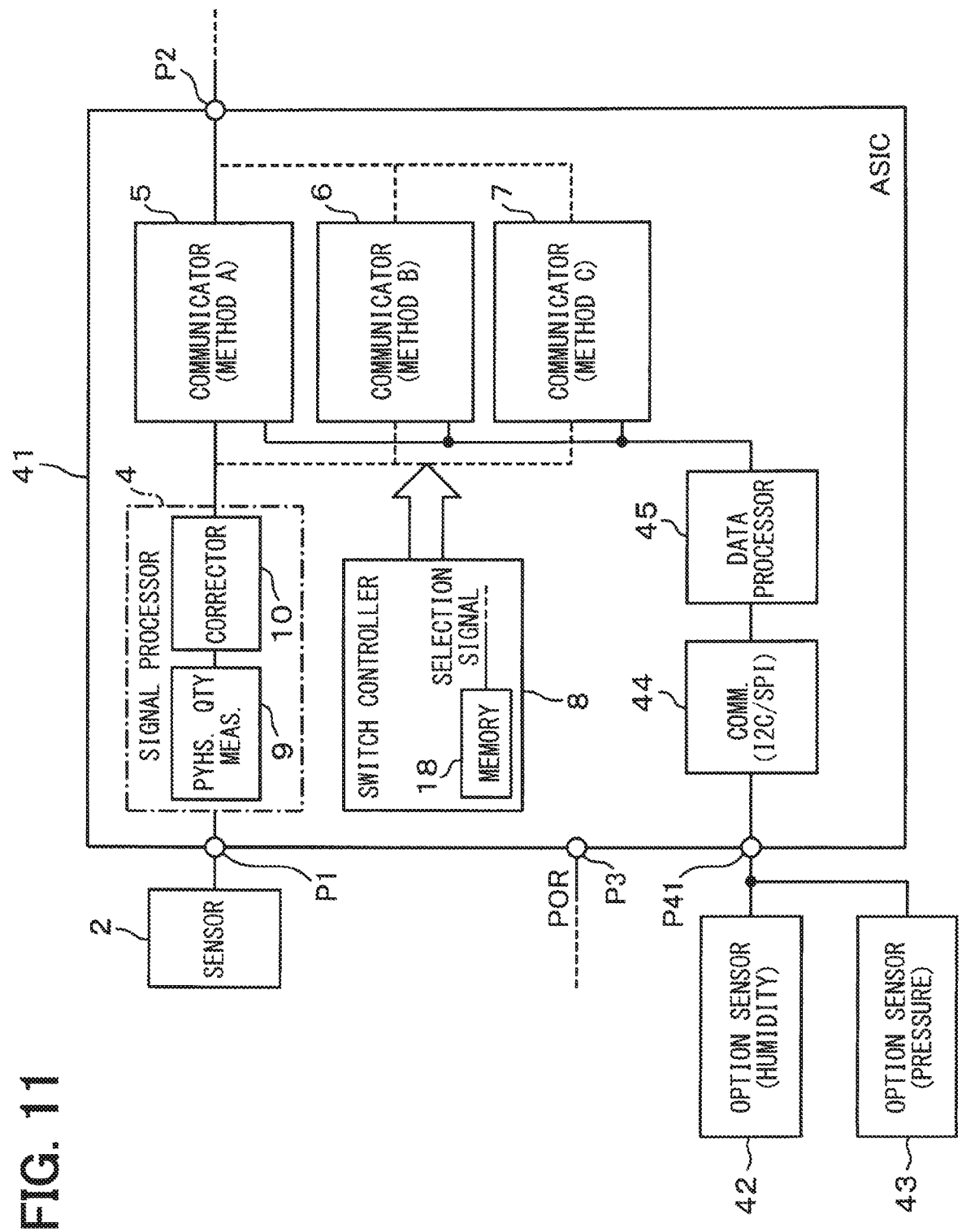
FIG. 11 illustrates a block diagram of the signal processing device.

As shown in FIG. 11, a signal processor 41 of the present embodiment processes detections signals that are input via a terminal P41 from an option sensor 42 which may be a moisture sensor and from an option sensor 43 which may be a pressure sensor, and outputs the processed data to the external ECU 3, or the like, by a communication process.

The signal processor 41 includes, in addition to the configuration of the signal processing device 1 of the first embodiment, a communicator 44 and a data processor 45.

The detection signal output from option sensors 42 and 43 is input to the communicator 44. The communicator 44 transmits the data representing the above-mentioned detection signal to the data processor 45 by serial communication protocol or interface such as I2C communication, SPI communication, and the like.

The data processor 45 performs data processing for the data transmitted from the communicator 44, which may include (i) a data reliability check (i.e., error check) using a method such as parity, CRC, etc. and (ii) processing the data based on the data format, and outputting the data after the processing to the communicators 5-7.

One of the communicators 5-7 which is selected according to the selection signal converts the data output from the data processor 45 to the communication data format of the currently-adopted communication method, and outputs the converted data via the output stage circuit.

Thus, according to the signal processor 41 of the present embodiment, the detection signals output from option sensors 42 and 43 for detecting humidity and pressure are, in addition to the detection signal outputted from the sensor 2 which is a suction airflow meter, processed by preset signal processing, and the data after the preset signal processing is output to the ECU 3 via communication.

OTHER EMBODIMENTS

The present disclosure is not limited to the above description and drawings, i.e., is not limited to the above-described embodiments, but may be modified to other forms. Further, the embodiments may be combinable with each other in part, or as a whole.

For example, in the above-described embodiments, three communicators 5-7 are provided, to implement three different communication methods. However, the number of communication methods may be two, four, or more, using a different number of communicators.

In the first determination method of the third embodiment, one comparator 25 is used with three threshold voltage Vth inputs. However, three comparators may be used. That is, a first comparator inputting the first threshold V1, a second comparator inputting the second voltage threshold V2, and a third comparator inputting the third threshold V3. In such manner, the communication method may be determined at one time, instead of advancing through the processes described above. The threshold voltage Vth may also be changed based on the number of the expected communication methods In the second determination method of the third embodiment, the constant current of the internal load 22 is switched to three values. However, the constant current may be switched to four or more values. In such manner, the communication method determination accuracy may be improved.

When repeating the comparison between the voltage Vo and the threshold Va, a binary search technique may be used. In such manner, the communication method may be determined more quickly.

The signal processor 41 of the fourth embodiment is able to provide signal processing for two option sensors 42 and 43. However, the signal processing may be made possible for one option sensor, or may be made possible for three or more option sensors.

Although the present disclosure has been described in connection with embodiments described above with reference to the accompanying drawings, various modifications become apparent to those skilled in the art, and such modifications and summarized schemes are to be understood as being within the scope of the present disclosure as defined by the appended claims.

What is claimed is:
1. A signal processing device comprising:
 a signal processor configured to perform a preset signal processing on a detection signal output from a sensor;
 a plurality of communicators, each of the plurality of communicators configured to convert processed data output from the signal processor to communication data based on different communication methods and to output the communication data from a single output terminal;

a switch controller configured to control an output operation of the communication data by the plurality of communicators;
an internal load configured to connect to the output terminal; and
a communication method selector configured to detect a voltage of an external device connected the output terminal and to generate the selection signal based on a comparison result between a detected voltage and a preset threshold, wherein
the switch controller is further configured to perform a switch operation that confirms the output operation of one of the plurality of communicators based on a selection signal for selecting one of the different communication methods, and to set an output state of all of the plurality of communicators to a high impedance state at least at a time of performing the switch operation,
the internal load includes a plurality of internal loads having different impedance values,
the communication method selector generates the selection signal based on the comparison result between the detected voltage and the preset threshold by connecting each of the plurality of internal loads one at a time to the output terminal, and
the communication method selector repeats the comparison between the detected voltage and the threshold in a descending order of impedance values for the plurality of internal loads.

2. The signal processing device of claim 1, wherein
the switch controller upon receiving a reset signal is further configured to set the output state of all of the plurality of communicators to the high impedance state during a period from a reception of the reset signal to a completion of the switch operation.

3. The signal processing device of claim 1, further comprising:
a high potential side driver configured to drive the output terminal to a high potential level; and
a low potential side driver configured to drive the output terminal to a low potential level, wherein the low potential side driver has a variable drive capacity.

4. The signal processing device of claim 3, wherein
the low potential side driver is configured to be controlled by a constant current control.

5. The signal processing device of claim 1, further comprising:
a digital-to-analog (D/A) converter configured to receive a digital communication from at least one of the plurality of communicators and to convert the digital communication to an analog output; and
a driver amplifier configured to amplify and to output the analog output of the D/A converter to the output terminal.

6. The signal processing device of claim 1, wherein
one of the different communication methods is a SENT communication.

7. The signal processing device of claim 1 further comprising:
a memory configured to store the selection signal.

8. The signal processing device of claim 1, wherein
the communication method selector uses a binary search for repeatedly conducting the comparison between the detected voltage and the threshold.

9. The signal processing device of claim 1, wherein
the impedance value of each of the plurality of internal loads is of a value that raises the detected voltage of the output terminal to a value that is higher than a determination threshold of a low potential side of an external controller configured to connect to the output terminal.

10. The signal processing device of claim 1, further comprising:
a high potential side driver configured to drive the output terminal to a high potential level; and
a low potential side driver configured to drive the output terminal to a low potential level, wherein the low potential side driver serves as the internal load.

11. The signal processing device of claim 1, wherein the sensor is an airflow meter.

* * * * *